United States Patent [19]

Beaufils et al.

[11] Patent Number: 5,101,151
[45] Date of Patent: Mar. 31, 1992

[54] PRINTED CIRCUIT BOARD TEST SYSTEM AND APPLICATION THEREOF TO TESTING PRINTED CIRCUIT BOARDS FORMING A DIGITAL SIGNAL MULTIPLEX-DEMULTIPLEX EQUIPMENT

[75] Inventors: Jean-Marie Beaufils, Paris; Jean-Loup Marot, Arpajon, both of France

[73] Assignee: Alcatel Cit, Paris, France

[21] Appl. No.: 544,722

[22] Filed: Jun. 27, 1990

[30] Foreign Application Priority Data

Jun. 27, 1989 [FR] France ................. 89 08562

[51] Int. Cl.⁵ ................. G01R 31/02; G01R 31/28
[52] U.S. Cl. ................. 324/158 R; 324/73.1; 324/158 P; 324/158 F; 371/22.6
[58] Field of Search ............. 324/158 R, 73.1, 158 F, 324/158 P; 371/15.1, 16.1, 22.1, 22.3, 22.6

[56] References Cited

U.S. PATENT DOCUMENTS

| | | | |
|---|---|---|---|
| 3,723,867 | 3/1973 | Canarutto | 324/158 F |
| 3,904,861 | 9/1975 | McNamara | 324/158 F |
| 3,924,109 | 12/1975 | Thu et al. | 371/22.6 |
| 4,176,780 | 12/1979 | Sacher et al. | 371/22.6 |
| 4,180,203 | 12/1979 | Masters | 371/22.6 |
| 4,216,539 | 8/1980 | Raymond et al. | 371/22.6 |
| 4,465,972 | 8/1984 | Sokolich | 324/158 F |
| 4,626,780 | 12/1986 | Powers et al. | 324/158 F |
| 4,746,855 | 5/1988 | Wrinn | 371/22.6 |
| 4,994,735 | 2/1991 | Leedy | 324/158 P |

FOREIGN PATENT DOCUMENTS 2738833  3/1979  Fed. Rep. of Germany.

OTHER PUBLICATIONS

IBM Tech. Discl. Bulletin, vol. 31, No. 2, Jul. 1988, "Card Testing in Target System", pp. 144–147.
IBM Tech. Discl. Bulletin, vol. 31, No. 1, Jun. 1988, "Debug Method for Logic Card", pp. 215–216.
IBM Tech. Discl. Bulletin, vol. 15, No. 5, Oct. 1972, "On Site Card Tester", pp. 1439–1440.

Primary Examiner—Kenneth A. Wieder
Assistant Examiner—Vinh P. Nguyen
Attorney, Agent, or Firm—Sughrue, Mion, Zinn, Macpeak & Seas

[57] ABSTRACT

A printed circuit board test system includes a test printed circuit board adapted to be connected to a printed circuit board to be tested. At least one of these two boards is equipped with circuits for selecting the types of signal processed by the board to be tested, adapted to place at least one subsystem of the latter either in a test configuration or in a normal configuration. The test board is provided with configuration control ports and equipped with circuits for connecting these ports to the selector circuits.

11 Claims, 5 Drawing Sheets

PRINTED CIRCUIT BOARD TEST SYSTEM AND APPLICATION THEREOF TO TESTING PRINTED CIRCUIT BOARDS FORMING A DIGITAL SIGNAL MULTIPLEX-DEMULTIPLEX EQUIPMENT

BACKGROUND OF THE INVENTION

1. Field of the invention board test system. The invention is particularly applicable to boards assembled into a common mechanical structure to form a complex functional equipment, for example a transmission equipment such as a digital multiplex-demultiplex equipment.

2. Description of the Prior Art

Commissioning and maintaining such equipment entails testing the individual boards constituting them. Carrying out these tests requires access to various points on a board under test in order to inject the required signal or to recover the signal to be monitored, these test points and signals varying according to the equipment type and the type of test. The techniques routinely used to this end generally require interrupting the signals normally processed by the board under test in order to substitute test signals for them and entail providing on the boards special ports (input/output points) which are either located directly on the front panel of the boards to be tested or grouped together on units usually called connection panels which have a specific location in the equipment.

As equipment becomes more and more miniaturized, it is becoming more and more difficult to use these techniques.

SUMMARY OF THE INVENTION

An object of the present invention is a test system by means of which this problem can be solved.

Another object of the present invention is a test system enabling the operator time needed to carry out the tests to be reduced, operator action with a system in accordance with the invention being limited to input of commands and requiring no manual intervention to carry out operations such as making and breaking connections and the like, to substitute test signals for the signals normally processed by the board.

The invention is directed to a printed circuit board test system comprising a test printed circuit board adapted to be connected to a printed circuit board to be tested, wherein at least one of these two boards is equipped with circuits for selecting the types of signal processed by the board to be tested, adapted to place at least one subsystem of the latter either in a test configuration or in a normal configuration, and wherein the test board is provided with configuration control ports and equipped with circuits for connecting these ports to said selector circuits.

Other objects and characteristics of the present invention will emerge more clearly on reading the following description of various embodiments with reference to the appended drawings.

DETAILED DESCRIPTION OF THE INVENTION

Figure 1:
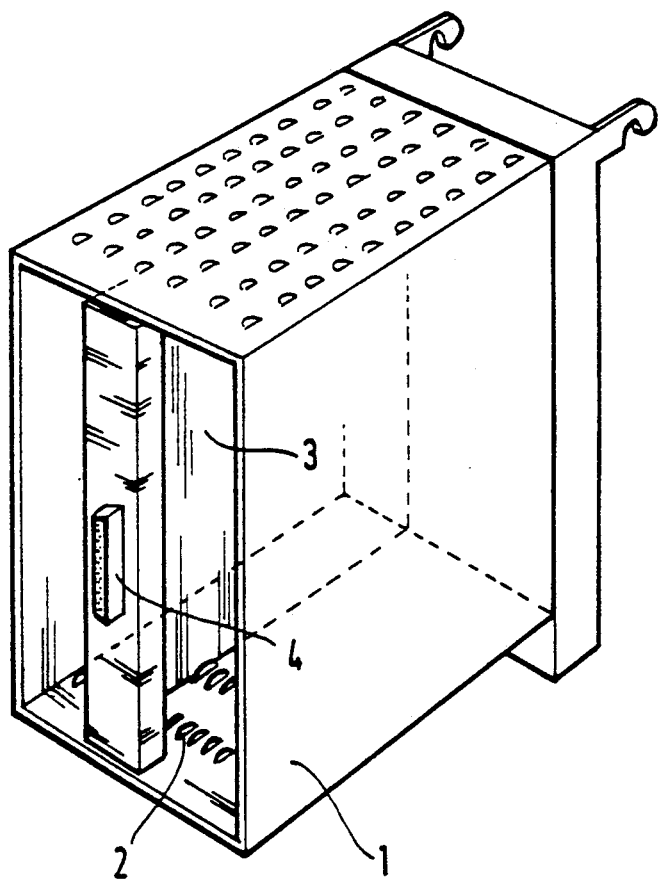
FIG. 1 is a perspective view of a board to be tested.

FIG. 1 shows in perspective a case 1 usually called a subrack fitted with slides 2 into which printed mounted printed circuit boards, called equipment boards 3, can be mounted, one of which is represented in the figure, the electrical circuit that it carries being omitted to avoid over complicating the figure.

This board, which constitutes the board to be tested, has on its front panel a multipin half-connector 4 providing access to the various points on the board to which the test operations relate.

Figure 2:
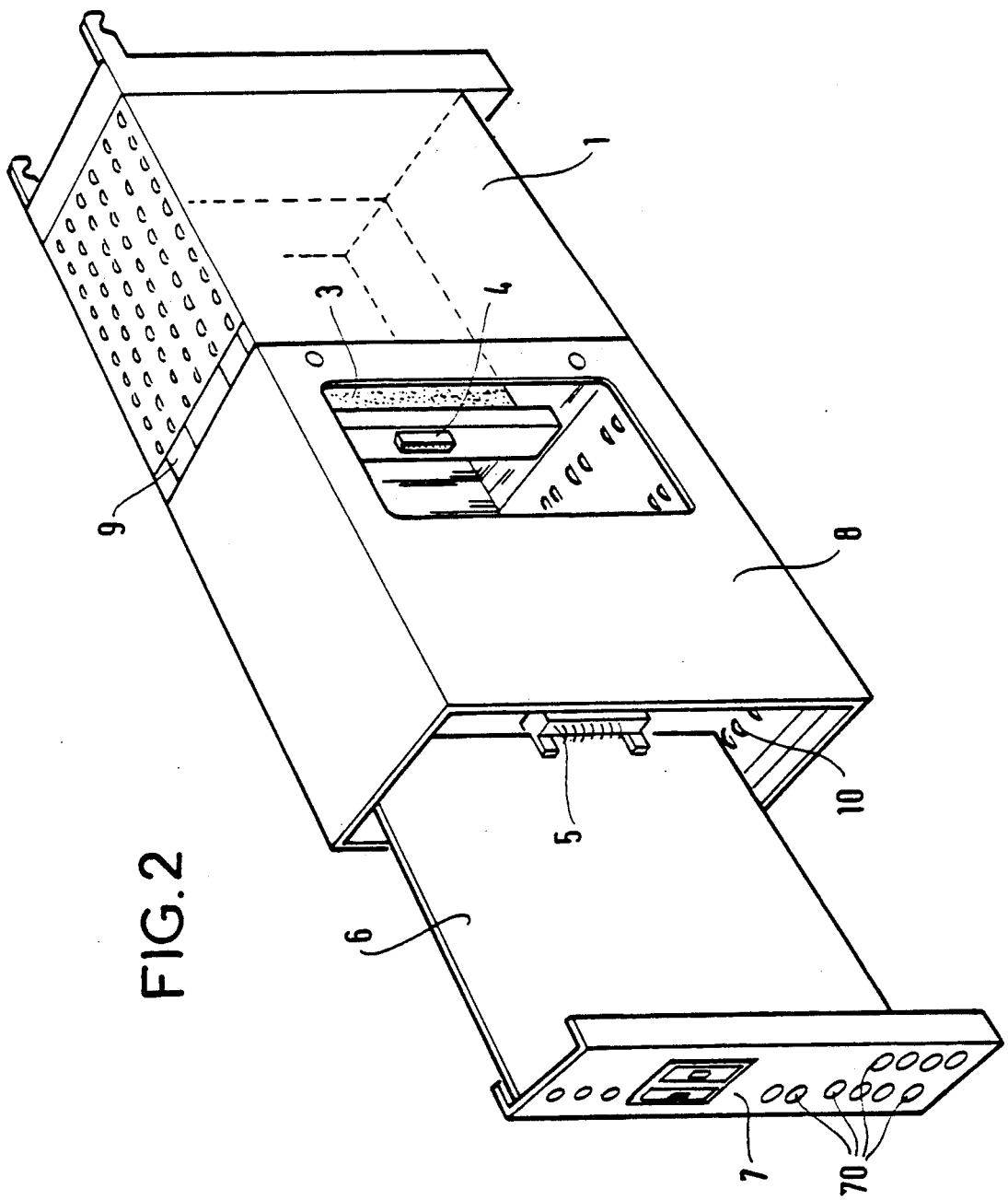
FIG. 2 is a perspective view of the board to be tested and the test board.

FIG. 2 shows in addition to the subrack 1 with the equipment board 3 fitted with the half-connector 4 a so-called test board 6 to which the equipment board 3 is to be connected in order to be tested. The test board 6, whose electrical circuit has not been shown either, is equipped on its rear panel with a multipin half-connector 5 complementary to the half-connector 4. The board 6 is provided on its front panel with control buttons, sockets for receiving external signals and indicator lamps, all these interfacing components 70 being grouped together on a panel 7 mechanically fastened to the board and electrically connected to its grounding point.

To improve the mechanical stability of the board to be tested/test board combination assembled together by means of the two half-connectors 4 and 5 an extension subrack 8 may be fixed to the subrack 1 by fixing means 9 before the two boards are assembled together by means of the half-connectors 4 and 5. The extension subrack is also provided with slides 10 in which the test board can then be mounted, in line with the board to be tested, and then connected to the latter as explained by means of the half-connectors 4 and 5.

There will now be described with reference to FIG. 3 a typical implementation of the electrical schematic of an equipment board to enable it to cooperate with a test board in a system in accordance with the invention, the electrical schematic of the test board being described later with reference to FIG. 4.

Figure 5:
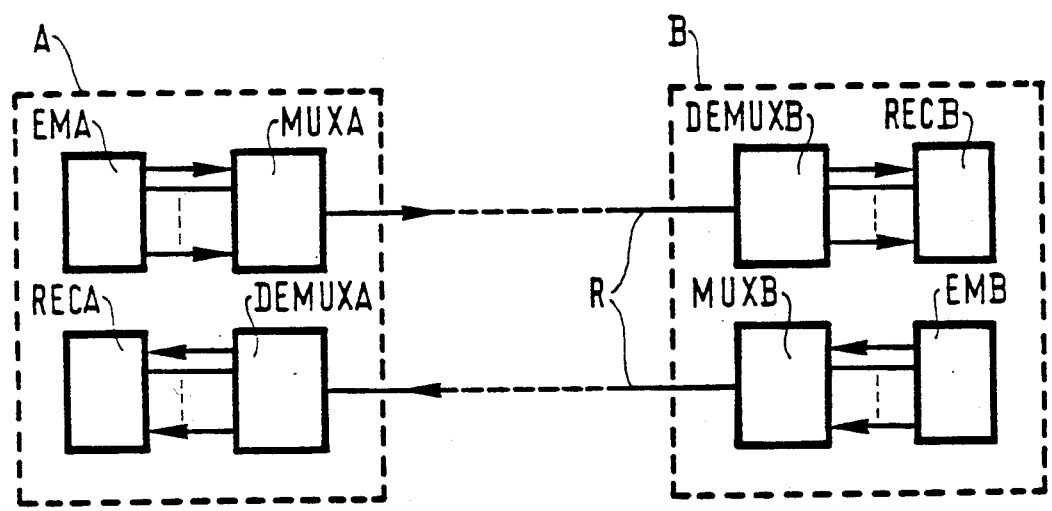
FIG. 5 summarizes the composition of a digital signal multiplex-demultiplex equipment.

By way of example there will now be considered the case of a transmission equipment comprising, as schematically represented in FIG. 5, a multiplex-demultiplex system equipping a station A connected by a transmission network R to another station B also equipped with a multiplex-demultiplex system, the multiplexers MUXA and MUXB of these stations being each connected in normal operation to a respective transmit equipment EMA and EMB and the demultiplexers DEMUXA and DEMUXB of the stations likewise being each connected to a respective receive equipment RECA and RECB.

The miniaturization of the latest generation equipment is such that a multiplexer-demultiplexer of one station, such as the combination MUXA-DEMUXA, can be accommodated on a single equipment board whose connections to the transmission network and to the transmit and receive equipment form a first series of ports of the board, called traffic, located on its rear panel and having no need to be modified during the testing of the board by the system in accordance with the invention, which constitutes one advantage of this system.

A second series of so-called test ports of the equipment board is provided by the connections to the multi-pin half-connector on the front panel of the board (the connector 4 in FIGS. 1 and 2).

Figure 3:
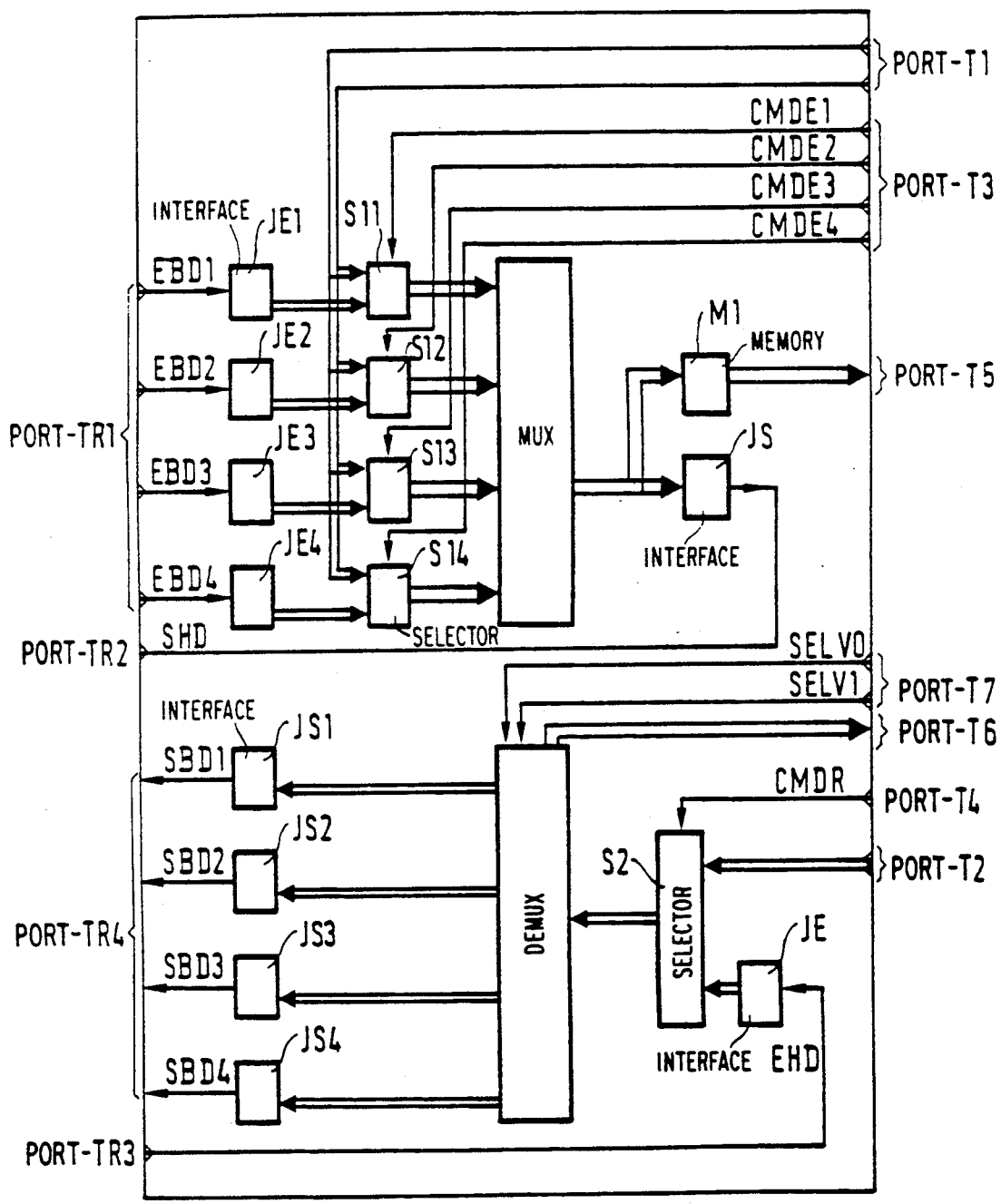
FIG. 3 is a typical electrical schematic of a board to be tested.
Figure 4:
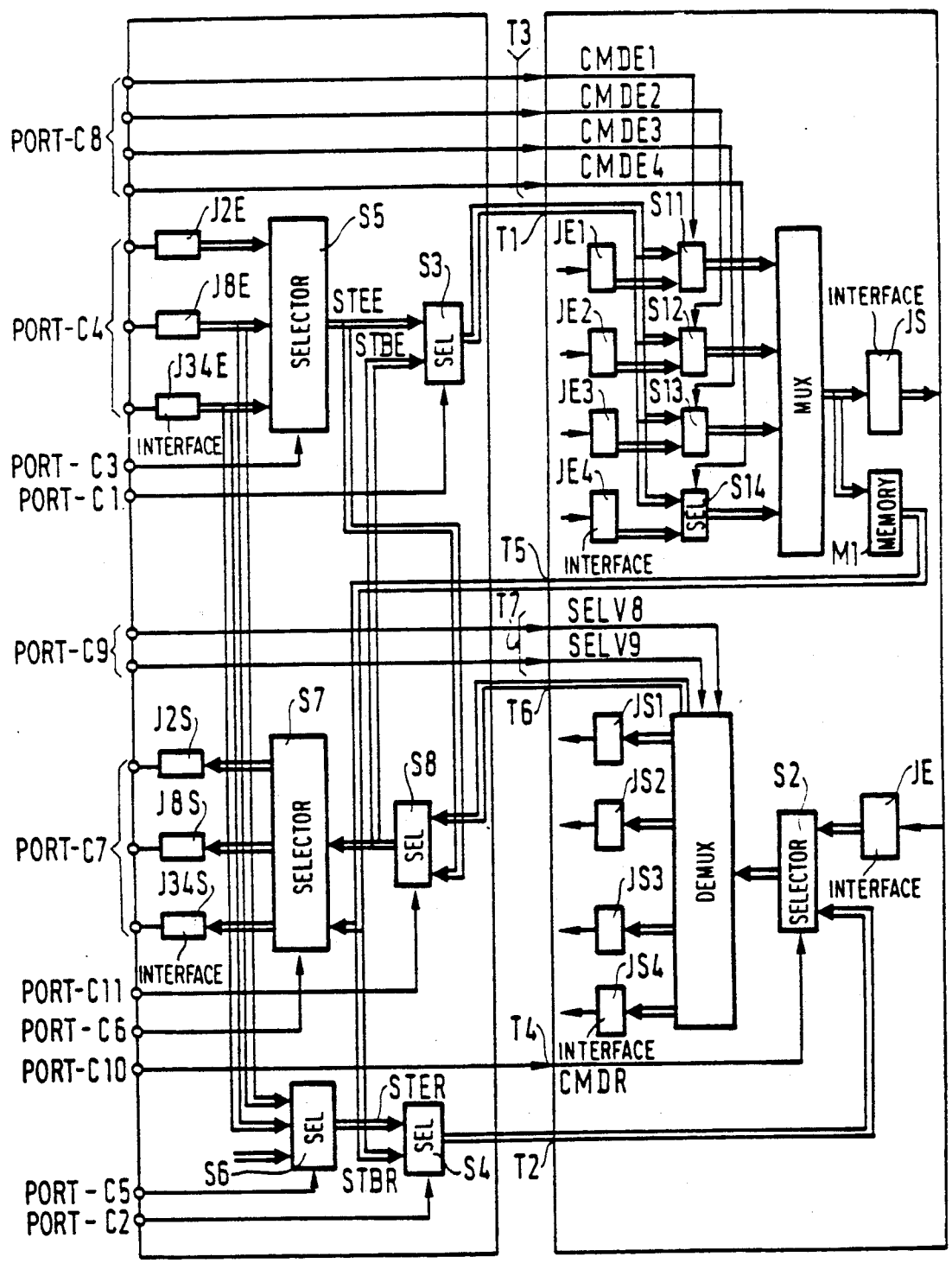
FIG. 4 is a typical electrical schematic of the test board.

The traffic ports include ports TR1 to which are applied the input traffic signals from the multiplexer, in this instance four inputs to which are applied respective low bit rate signals EBD1 through EBD4 in the example shown in FIG. 3, a port TR2 carrying the high bit rate output traffic signal SHD from the multiplexer, a port TR3 to which the high bit rate input traffic signal EHD from the demultiplexer is applied and ports TR4 carrying the low bit rate output traffic signals from the demultiplexer, in this instance four outputs carrying respective low bit rate signals SBD1 through SBD4.

In the known way a multiplexer-demultiplexer printed circuit board carries an integrated circuit MUX implementing the multiplexing function receiving the low bit rate input traffic signals EBD1-EBD4 through low bit rate input interface circuits JE1-JE4 and supplying the high bit rate output traffic signal SHD through a high bit rate output interface circuit JS.

The multiplexer-demultiplexer printed circuit board also carries an integrated circuit DEMUX implementing the demultiplexing function receiving on its input the high bit rate input traffic signal EHD through a high bit rate input interface circuit JE and supplying the low bit rate output traffic signals SBD1-SBD4 through low bit rate output interface circuits JS1-JS4.

In accordance with the invention, the inputs of the multiplexer integrated circuit MUX are not connected to the outputs of the low bit rate input interfaces JE1--JE4 directly, but instead through the intermediary of a respective selector unit S11-S14 for selecting either the traffic signals or test signals applied to the test ports T1 of the equipment board.

In a similar way the inputs of the demultiplexer integrated circuit MUX are not connected to the outputs of the high bit rate input interface directly but instead through a selector unit S2 for selecting either the traffic signal or a test signal applied to test ports T2 of the equipment board.

In the example under consideration the output signals from the low bit rate input interfaces are two binary signals respectively representing the positive and negative pulses of a bipolar code digital signal and the test signals applied to the ports T1 are two similarly constituted binary signals.

Likewise, the output signals of a low bit rate input interface in the example under consideration are four binary signals respectively representing the positive and negative pulses of a bipolar code digital signal, the clock signal and an alarm signal indicating failure of the received signal, and the test signals applied to the test ports T2 are four similarly constituted binary signals. Test ports T3 and T4 are also provided to receive control signals from the respective selector units S11-S14 and S2.

In the example under consideration, the multiplexer integrated circuit MUX has four low bit rate inputs, there are four selector units S11-S14 and there are four selection control binary signals CMDE1-CMDE4 applied to the test ports T3.

The demultiplexer high bit rate input selector unit S2 is controlled by a binary signal CMDR applied to the test port T4 and used to select either the high bit rate traffic signal or the high bit rate test signal.

The multiplex-demultiplex equipment board shown in FIG. 3 is further provided with means for duplicating the output signals of the multiplexer integrated circuit MUX and the demultiplexer integrated circuit DEMUX to provide the duplicated signals on test ports T5 in the case of the multiplexer and T6 in the case of the demultiplexer.

In the example under consideration, the signals obtained at the ports T5 are obtained at the output of a memory unit M1 receiving said signals from the multiplexer MUX, the signals obtained at the ports T6 being obtained direct from the output of the demultiplexer DEMUX including a memory unit M2 similar to M1.

Test ports T7 are further provided for selecting one of the four low bit rate outputs of the demultiplexer to be duplicated, to which are applied in this instance two signals SELV0 and SELV1, subsequently applied directly to the demultiplexer.

The schematic of the test board is now described with reference to FIG. 4. For a better understanding of how this board cooperates with the equipment board described above, the schematic of the latter has been repeated in this figure.

The test board is provided with a first series of ports corresponding to the test ports on the equipment board and formed by the connections to the multipin half-connector on the rear panel of this board (denoted 5 in FIG. 2) and a second set of so-called control ports corresponding to the ports of the external interface panel (denoted 7 in FIG. 2) fitted to the front panel of the test board.

The test board comprises means for selecting test signals to be applied to the multiplexer-demultiplexer board. These test signal selector means comprise, associated with the multiplexer MUX, a selector unit S3 controlled by the signals applied to control ports C1 of the test board and enabling application to the test ports T1 of the multiplexer-demultiplexer board of either an external test signal STEE or a loopback test signal STBE and, similarly, associated with the demultiplexer DEMUX, a selector unit S4 controlled by the signals applied to control ports C2 of the test board and enabling application to the test ports T2 of the equipment board to be tested of either an external test signal STER or a loopback test signal STBR.

As this test board is designed for testing multiplexer-demultiplexer boards that can operate at various bit rates, the external test signal STEE applied to the selector unit S3 is itself obtained at the output of a selector unit S5 which can receive on its input side multiple possible test signals corresponding to different possible bit rates and obtained, for example, from a test signal generator connectable to the external interface panel of the board.

In this instance three signals are considered corresponding to three different bit rates: 2 Mbit/s, 8 Mbit/s and 34 Mbit/s. These are binary signals applied to the selector unit S5 after passing through the input interfaces J2E, J8E and J34E respectively corresponding to the different bit rates and having a similar interface function to the low bit rate input interfaces JE1-JE4 or the high bit rate input interface JE of the multiplexer-demultiplexer board. The inputs of the input interfaces J2E, J8E, J34E form control ports C4 of the test board.

Likewise the external test signal STER applied to the selector unit S4 is obtained from the output of a selector unit S6 which receives on its input side the output signals from the input interfaces J8E and J34E and which is controlled by the signals applied to control ports C5 of the test board.

The way in which the loopback test signals STBE and STBR are obtained will emerge from the following description of the test board.

The test board further comprises selector means for selecting various bit rates of signals to be observed at the output of the multiplexer-demultiplexer board. These means of selecting different bit rates of signals to be observed include a selector unit S7 controlled by signals applied to control ports C6 of the test board and used to switch the signals available at the test port T6 (that is to say the signals available at the output of the demultiplexer integrated circuit selected by the signals applied to the test port T7 together with the signals available at the output of the multiplexer integrated circuit) to two of the three output interfaces J2S, J8S, J34S selected on the basis of bit rates corresponding to the multiplexer-demultiplexer board tested, in this instance 2 Mbit/s and 8 Mbit/s or 8 Mbit/s and 34 Mbit/s, these output interfaces having an interface function similar to that of the high bit rate output interface JS or the low bit rate output interfaces JS1-JS4.

The loopback test signals STBE and STBR are formed by the signals respectively available at the test ports T6 and T5.

The outputs of the output interfaces J2S, J8S, J34S constitute control ports C7 of the test board. The output of the selected interface is connected to a measuring unit through the board's external interface panel.

The test ports T3, T7 and T4 are simply extended across the test board to form the control ports C8, C9 and C10 of this board.

The application of a test signal to one of the low bit rate inputs of the multiplexer integrated circuit entails the following operations:
- selection of the low bit rate input in question of the multiplexer integrated circuit by application of appropriate control signals CMDE1-CMDE4 to the control ports C8,
- selection of the type of test signal to be applied: external test signal or loopback test signal, by application of appropriate control signals to the control ports C1,
- if the test signal to be applied is an external test signal, connection of a test signal generator to the input of one of the input interfaces J2E, J8E selected according to the multiplexer-demultiplexer board to be tested by application of appropriate signals to the control ports C3,
- if the test signal to be applied is a loopback test signal, selection by the control port C9 of the output of the demultiplexer integrated circuit which is to be looped to the input in question of the multiplexer integrated circuit.

Similarly the application of a test signal to the high bit rate input of the demultiplexer integrated circuit entails the following operations:
- application of appropriate signals to the control ports C10 to switch test signals instead of traffic signals to the demultiplexer input,
- application of appropriate signals to the control ports C2 in order to switch to the high bit rate input of the demultiplexer either an external test signal or a loopback test signal,
- if the test signal to be applied is an external test signal, connection of a test signal generator to the input of one of the interfaces JE8, J34E selected according to the multiplexer-demultiplexer board to be tested by application of appropriate signals to the control ports C5.

Observation of the low bit rate output signals obtained at one output of the demultiplexer integrated circuit entails the following operations:
- application of appropriate signals to the control ports C9 to select the low bit rate output in question the demultiplexer integrated circuit,
- application of appropriate signals to the control ports C6 of the selector unit S7 to connect the output interface J2S or J8S corresponding to the required bit rate to the duplicated output of the demultiplexer integrated circuit,
- connection of a measuring device to the output of the output interface J2S or J8S connected in this way to this duplicated low bit rate output.

Observation of the high bit rate output signals obtained at the output of the multiplexer integrated circuit entails the following operations:
- application of appropriate signals to the control ports C6 of the selector unit S7 to connect the output interface J8S or J34S corresponding to the required bit rate to the duplicated high bit rate output of the multiplexer integrated circuit,
- connection of a measuring instrument to the output of the output interface J8S or J34S connected in this way to this duplicated high bit rate output.

It is possible to observe simultaneously low bit rate output signals at one output of the demultiplexer integrated circuit and high bit rate output signals at the output of the multiplexer integrated circuit, the selector unit S7 enabling its two inputs to be connected to any two of its outputs.

The test system described therefore makes it possible to observe the resulting signal after multiplexing and/or one of the component signals after demultiplexing, in the normal operating configuration of the equipment board and in the following test configurations:
a) with one low bit rate output of the demultiplexer integrated circuit looped to one low bit rate input of the multiplexer integrated circuit,
b) with the high bit rate output of the multiplexer integrated circuit looped to the high bit rate input of the demultiplexer integrated circuit,
c) with a test signal applied instead of one of the low bit rate input signals of the multiplexer integrated circuit,
d) with a test signal applied instead of the high bit rate input signal of the demultiplexer integrated circuit It is also possible to combine configurations b and c, on the one hand, and configurations and d on the other hand, and to combine either configuration b or d with a normal configuration of the multiplexer equipment and either configuration or with a normal configuration of the demultiplexer equipment.

It is also possible to test the test board itself by looping the output of the selector unit S5 to an input of the selector unit S7. The input signal of the selector unit S7 is then obtained at the output of a selector unit S8 with first inputs connected to the outputs S5 and second inputs connected to one of the duplicated outputs, for example those of the demultiplexer integrated circuit as shown in FIG. 4, and with control inputs constituting control ports C11 of the test board.

The selector units are controlled in such a way that, for a 2 Mbit/s-8 Mbit/s multiplex-demultiplex equipment, for example, the input of the selector unit S5 selected is that connected to the output of the input interface J2E and the output of the selector unit S7 selected for connection to the duplicated output of the multiplexer integrated circuit is that connected to the input of the output interface J8S while the output of the selector unit S7 selected for connection to the duplicated output of the demultiplexer integrated circuit is that connected to the input of the interface J2S.

The equipment and test boards described above may be implemented in numerous variants, in particular with respect to:

the bit rates defining the equipment boards to be tested, 34 Mbit/s–140 Mbit/s multiplex-demultiplex equipments being additionally provided for, for example, the distribution of the various selector units between the equipment board and the test board, the location of the various selector units on the test board, for example their location on the input or output side of the input and output interfaces (with the attendant repercussions as to the number and location of these interfaces on these boards), or their greater or lesser integration with the multiplexer and demultiplexer integrated circuits.

What is more, the contents of the test board and the equipment board could obviously be substantially different in the case of equipments other than a digital signal multiplex-demultiplex equipment.

There is claimed:

1. A printed circuit board test system comprising a first printed circuit board adapted to be connected to a second printed circuit board, the second printed circuit board comprising a board to be tested, wherein at least one of the first and second boards is equipped with selector circuits for selecting the types of signal processed by the second board, adapted to place at least one subsystem of the second board either in a test configuration or in a normal configuration, and wherein the first board is provided with configuration control ports and equipped with connection means for connecting these ports to said selector circuits.

2. A system according to claim 1, wherein the second board and the first board can be interconnected by two respective complementary multipin half-connectors.

3. A system according to claim 1, wherein the second board is disposed in subrack, the first board is mounted in an extension subrack before being connected to the second board, and the subrack and the extension subrack are assembled together.

4. A printed circuit board test system comprising a first test printed circuit board adapted to be connected to a second printed circuit board, the second printed circuit board comprising a board to be tested, wherein at least one of the first and second boards is equipped with mode selector circuits for selecting the types of signal processed by the second board, adapted to place at least one subsystem of the second board either in a test configuration or a normal configuration, and wherein the first board is provided with configuration control ports and equipped with connection means for connecting these ports to said mode selector circuits, wherein the board to be tested forms a digital signal multiplex-demultiplex equipment wherein said mode selector circuits for selecting the signal types processed by the second board are adapted to place a multiplexer or a demultiplexer of the digital signal multiplex-demultiplex equipment in the test configuration or in the normal configuration, and in that at least one of the first and second boards comprises test signal selector circuits for applying to the second board in the test configuration of the multiplexer and/or the demultiplexer either an external test signal or a loopback test signal obtained from the demultiplexer for testing the multiplexer or from the multiplexer for testing the demultiplexer.

5. A test system according to claim 4, wherein at least one of the first and second boards comprises bit rate selector circuits for selecting different bit rates of external test signals applied to the second board or different bit rates of signals to be observed at the output of the latter.

6. A system for testing a printed circuit board, the printed circuit board has a input portion and an output portion, said system comprising:

control signal input means for receiving control signals, operation mode selection means for selecting one of a test mode and a normal mode for said system in accordance with at least one of the control signals, external signal input means for receiving external signals for testing the printed circuit board; and test mode selection means for selecting, during the test mode, one of a loopback test mode and an external test mode in accordance with at least one of the control signals, wherein the output from the output portion is looped back to the input portion when said test mode selection means selects the loopback test mode, and the input to the input portion is provided by said external signal input means when said test mode selection means selects the external test mode.

7. A system according to claim 6, wherein the external signals have different bit rates for testing the printed circuit board at different bit rates.

8. A system according to claim 7, wherein the printed circuit board to be tested is a multiplex-demultiplex circuit.

9. A system according to claim 6, wherein said control signal input means, said external signal input means and said test mode selection means resides on a test board, the test board is operatively connected to the printed circuit board to be tested.

10. A system according to claim 6, wherein only said operation mode selection means resides on the printed circuit board to be tested.

11. A system according to claim 6, wherein said system further comprises self-tested selection means for selecting a self-test mode for a test board, the rest board operatively connects to the printed circuit board to be tested.

* * * * *